United States Patent
Yagi et al.

(10) Patent No.: US 10,757,845 B2
(45) Date of Patent: Aug. 25, 2020

(54) HIGH-FREQUENCY COMPONENT PROVIDED WITH A SHIELD CASE

(71) Applicant: Murata Manufacturing Co., Ltd., Kyoto (JP)

(72) Inventors: Yoshikazu Yagi, Kyoto (JP); Kazushige Sato, Kyoto (JP); Akihiro Hara, Kyoto (JP); Noboru Morioka, Kyoto (JP); Nobumitsu Amachi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/299,328

(22) Filed: Mar. 12, 2019

(65) Prior Publication Data
US 2019/0215993 A1    Jul. 11, 2019

Related U.S. Application Data

(63) Continuation of application No. PCT/JP2017/033636, filed on Sep. 19, 2017.

(30) Foreign Application Priority Data

Sep. 21, 2016  (JP) ................................. 2016-184578

(51) Int. Cl.
*H05K 9/00* (2006.01)
*H01L 23/02* (2006.01)
(Continued)

(52) U.S. Cl.
CPC ........... *H05K 9/0007* (2013.01); *H01L 23/02* (2013.01); *H01L 23/552* (2013.01);
(Continued)

(58) Field of Classification Search
CPC ................. H01L 23/552; H01L 23/02; H05K 2201/10371; H05K 1/0216; H05K 1/0237;
(Continued)

(56) References Cited

U.S. PATENT DOCUMENTS 8,436,439 B2 * 5/2013 Pagaila ................ H01L 21/565
257/431
9,007,273 B2 * 4/2015 Liao ...................... H01L 23/481
343/841
(Continued)

FOREIGN PATENT DOCUMENTS

JP     H04-12589 A    1/1992
JP     H08-8571 A     1/1996
(Continued)

OTHER PUBLICATIONS

International Search Report for International Application No. PCT/JP2017/033636 dated Dec. 12, 2017.
(Continued)

*Primary Examiner* — James Wu
(74) *Attorney, Agent, or Firm* — Pearne & Gordon LLP

(57) ABSTRACT

A high-frequency component includes a wiring substrate, a component mounted on an upper surface of the wiring substrate, a columnar member formed of a conductive resin and standing on the upper surface of the wiring substrate in a state of a lower end portion of the columnar member being fixed to the upper surface of the wiring substrate, and a shield case covering the component and the columnar member. The shield case has a lid plate disposed so as to face the upper surface of the wiring substrate and a side plate extending from an edge of the lid plate toward the upper surface of the wiring substrate, and an upper end portion of the columnar member is fixed to each of four corner portions
(Continued)

of the lid plate, when viewed in a direction perpendicular to the upper surface of the wiring substrate.

6 Claims, 5 Drawing Sheets

(51) Int. Cl.
- *H01L 23/552* (2006.01)
- *H05K 3/32* (2006.01)
- *H05K 1/18* (2006.01)
- *H05K 5/02* (2006.01)
- *H05K 1/02* (2006.01)

(52) U.S. Cl.
CPC ........... *H05K 1/0237* (2013.01); *H05K 1/182* (2013.01); *H05K 3/32* (2013.01); *H05K 5/0239* (2013.01); *H05K 9/0028* (2013.01)

(58) Field of Classification Search
CPC .. H05K 1/182; H05K 2201/0367; H05K 3/32; H05K 5/0239; H05K 9/0007; H05K 9/0028
See application file for complete search history.

(56) References Cited

U.S. PATENT DOCUMENTS

| | | | |
|---|---|---|---|
| 9,754,897 B2 * | 9/2017 | Lin | ............... H01L 23/552 |
| 2010/0265663 A1 | 10/2010 | Yamashita et al. | |
| 2017/0148744 A1 * | 5/2017 | Carson | ............. H01L 23/49811 |

FOREIGN PATENT DOCUMENTS

| | | |
|---|---|---|
| JP | H10125830 A | 5/1998 |
| JP | H011-74669 A | 3/1999 |
| JP | 2003-283168 A | 10/2003 |
| JP | 2003-347755 A | 12/2003 |
| JP | 2004-111627 A | 4/2004 |
| JP | 2009-277910 A | 11/2009 |
| JP | 2010-258008 A | 11/2010 |
| JP | 4650194 B2 | 3/2011 |
| WO | 2012/105394 A1 | 8/2012 |

OTHER PUBLICATIONS

Written Opinion for International Application No. PCT/JP2017/033636 dated Dec. 12, 2017.

* cited by examiner

- PRIOR ART -

HIGH-FREQUENCY COMPONENT PROVIDED WITH A SHIELD CASE

This is a continuation of International Application No. PCT/JP2017/033636 filed on Sep. 19, 2017 which claims priority from Japanese Patent Application No. 2016-184578 filed on Sep. 21, 2016. The contents of these applications are incorporated herein by reference in their entireties.

BACKGROUND OF THE DISCLOSURE

Field of the Disclosure

The present disclosure relates to a high-frequency component provided with a shield case.

Description of the Related Art

A shield case for shielding a high-frequency component against electromagnetic waves may be provided in or on the high-frequency component mountable on a portable terminal device or the like. For example, as illustrated in FIG. 9, a high-frequency component 100 described in Patent Document 1 includes a module substrate 101 made of an insulating substrate such as ceramic, a circuit component (not shown) mounted on an upper surface of the module substrate 101, and a shield case 102 fixed to the module substrate 101 so as to cover the circuit component.

In addition, a concave portion 101a is formed at a substantially central portion of each of the four sides of the module substrate 101, and a ground electrode is formed on an inner surface of each concave portion 101a. A leg portion 102a which is inserted into a corresponding one of the concave portions 101a is integrally protruded downwardly at each lower end portion of the side walls of the shield case 102. The ground electrode of each concave portion 101a is connected to each leg portion 102a of the shield case 102 by soldering. Further, a thermosetting adhesive 103 is respectively applied between each of the four corner portions of the module substrate 101 and each of the four corner portions of the shield case 102, so as to firmly fix the module substrate 101 to the shield case 102.

Patent Document 1: Japanese Patent No. 4650194 (see, for example, Paragraphs 0014 to 0017, FIG. 1, FIG. 3, and the like).

BRIEF SUMMARY OF THE DISCLOSURE

However, in a structure of the high-frequency component 100 of the related art, there is a problem in that a space is required for forming the concave portion 101a in the module substrate 101 or disposing an adhesive to be used for fixing the shield case 102, which makes it difficult to reduce the size of the high-frequency component 100.

In consideration of the above-mentioned problem, it is an object of the present disclosure to reduce the size of a high-frequency component provided with a shield case.

In order to achieve the above object, a high-frequency component of the present disclosure includes a wiring substrate, a component mounted on a main surface of the wiring substrate, a columnar member made of a conductive resin and standing on the main surface of the wiring substrate in a state of one end of the columnar member being fixed to the main surface of the wiring substrate, and a shield case which covers the component and the columnar member. The shield case includes a lid plate disposed so as to face the main surface of the wiring substrate and a side plate that extends from an edge of the lid plate toward the main surface of the wiring substrate, and the other end of the columnar member is fixed to an end edge portion of the lid plate when viewed in a direction perpendicular to the main surface of the wiring substrate.

According to this configuration, since the shield case is fixed to the wiring substrate by the columnar member covered with the shield case, there is no need to provide a space for disposing an adhesive for fixing on an outer side portion of the shield case as in the case of a high-frequency component of the related art. Further, since the columnar member is formed of a conductive resin, by disposing the columnar member on a ground electrode of the wiring substrate, it is not necessary to provide a concave portion for forming the ground electrode on the wiring substrate as in the case of the high-frequency component of the related art. Therefore, the size of the high-frequency component provided with the shield case can be reduced.

In addition, the lid plate may have a bent portion on a peripheral line thereof when viewed in a direction perpendicular to the main surface of the wiring substrate, and the other end of the columnar member may be fixed to a predetermined region including the bent portion of the end edge portion of the lid plate.

According to this configuration, when the lid plate has, for example, a rectangular shape, the columnar member can be made to function as a pin for positioning by disposing the columnar member at each of the four corners of the bent portion. As a method of forming a shield case at a low cost, a method of forming a single plate in a predetermined shape and then bending may be considered. In such a method, when a shield case having a rectangular lid plate is formed, for example, there is a problem in that joints of side plates may be formed at four corners, and shield characteristics may be deteriorated due to the gaps of the joints. However, as in this configuration, by disposing the columnar members at four corners of the lid plate, the gaps between the side plates can be closed, so that the shield characteristics can be maintained while the shield case is formed by an inexpensive method.

In addition, the high-frequency component may further include a connecting member disposed between the component and the lid plate and connecting the component and the lid plate to each other, and the connecting member may be formed of the same conductive resin as the columnar member.

According to this configuration, the heat generated from the component can be easily dissipated. Further, since the connecting member and the columnar member are made of the same conductive resin, a manufacturing cost of the high-frequency component can be reduced. Further, if the materials constituting both members are different from each other, the stress may be applied to both ends of the columnar member due to the difference in an amount of shrinkage, or the like when both members are cured, but when both members are made of the same material, the stress applied to both ends of the columnar member can be reduced, and the reliability of the connection between the columnar member and the wiring substrate, and the reliability of the connection between the columnar member and the shield case can be improved. Further, even when external stress acts on the shield case, the lid plate can be prevented from coming into contact with the component by the connecting member, so that it is not necessary to provide a margin for preventing the contact between the component and the lid plate, and thus the height of the high-frequency component can be reduced.

Further, the other end of the columnar member may have a shape that is larger than a cross section of the other portion of the columnar member.

According to this configuration, the connectivity between the other end of the columnar member and the shield case can be improved.

According to the present disclosure, since the shield case is fixed to the wiring substrate by the columnar member covered with the shield case, it is not necessary to provide a space for disposing an adhesive for fixing on an outer side portion of the shield case as in the case of a high-frequency component of the related art. Further, since the columnar member is formed of a conductive resin, by disposing the columnar member on the ground electrode of the wiring substrate, it is not necessary to provide a concave portion for forming the ground electrode on the wiring substrate as in the case of the high-frequency component of the related art. Therefore, the size of the high-frequency component provided with the shield case can be reduced.

DETAILED DESCRIPTION OF THE DISCLOSURE

First Embodiment

A high-frequency component according to a first embodiment of the present disclosure will be described with reference to FIG. 1 to FIG. 3. Note that FIG. 1 is a sectional view of the high-frequency component, FIG. 2 is a plan view of the high-frequency component, and FIG. 3 is a developed view of a shield case.

Figure 1:
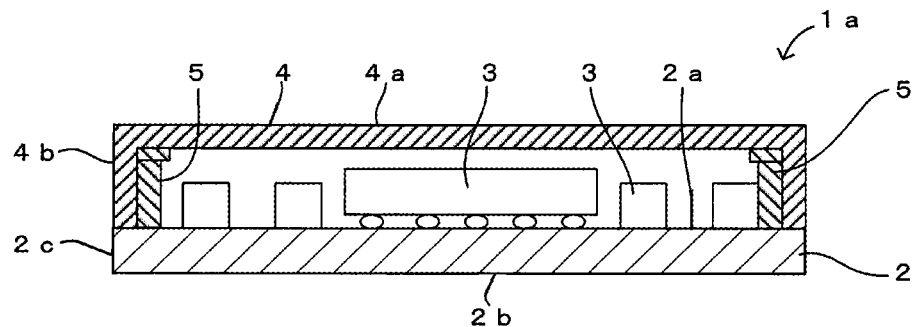
FIG. 1 is a sectional view of a high-frequency component according to a first embodiment of the present disclosure.
Figure 2:
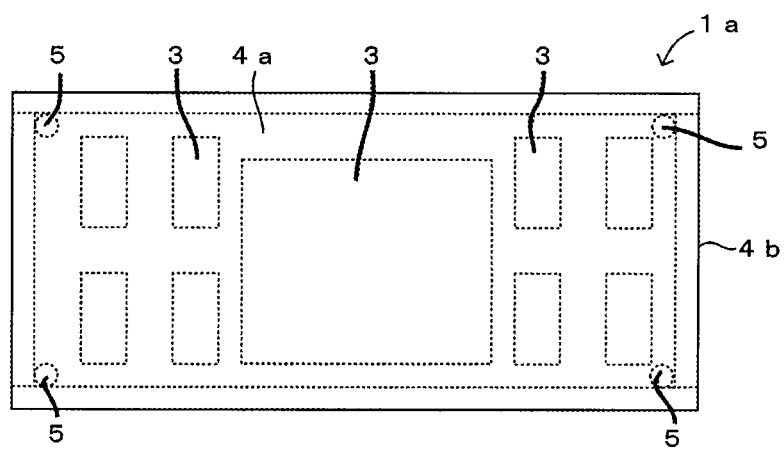
FIG. 2 is a plan view of the high-frequency component in FIG. 1.
Figure 3:
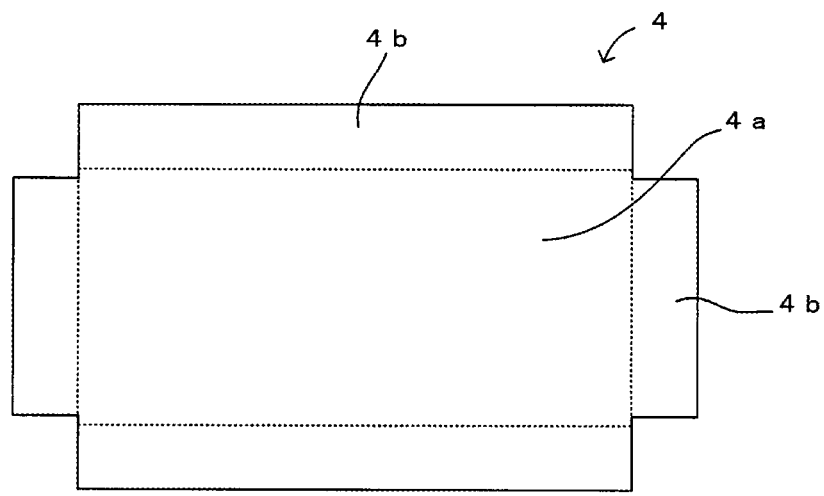
FIG. 3 is a diagram illustrating a shield case in FIG. 1.

As illustrated in FIG. 1 and FIG. 2, the high-frequency component 1a according to this embodiment includes a wiring substrate 2, a plurality of components 3 mounted on an upper surface 2a of the wiring substrate 2, a shield case 4 fixed to the upper surface 2a of the wiring substrate 2, and a plurality of columnar members 5 disposed inside the shield case 4, and is disposed in, for example, a communication terminal device.

The wiring substrate 2 is made of, for example, LTCC (low-temperature co-fired ceramic), HTCC (high-temperature co-fired ceramic), or glass epoxy resin, and various wiring electrodes (not shown) and via conductors (not shown) are formed inside and on a surface (the upper surface 2a and a lower surface 2b) of the wiring substrate 2.

The components 3 are, for example, a semiconductor element made of Si or the like, a chip capacitor, a chip inductor, a chip resistor, or the like.

The shield case 4 includes a lid plate 4a disposed so as to face the upper surface 2a of the wiring substrate 2 and a side plate 4b extending from an edge of the lid plate 4a toward the upper surface 2a of the wiring substrate 2 and is formed in a box shape that is open in a direction from the lid plate 4a toward the upper surface 2a of the wiring substrate 2. As illustrated in FIG. 2 and FIG. 3, the lid plate 4a is formed into a shape in which four bent portions are formed on a peripheral line of the lid plate 4, that is, a rectangular shape having four corner portions (corresponding to a "predetermined region including the bent portion" of the present disclosure) when viewed in a direction perpendicular to the upper surface 2a of the wiring substrate 2. Further, the shield case 4 is disposed on the wiring substrate 2 in a state in which an end portion of the side plate 4b opposite to the lid plate 4a is in contact with the upper surface 2a of the wiring substrate 2. At this time, the lid plate 4a of the shield case 4 and the upper surface 2a of the wiring substrate 2 are disposed so as to face to each other. Note that the shield case 4 is formed of, for example, a conductive metal such as Al.

In this embodiment, the shield case 4 is formed by processing a single metal plate. For example, as illustrated in FIG. 3, a single metal plate is processed into a shape in which a single rectangular lid plate 4a and four rectangular side plates 4b are integrally formed on the same plane (the shape shown in the developed view of the shield case 4). Then, from this state, each of the side plates 4b is bent at approximately 90°, and the shield case 4 is formed in a box shape. Note that, in this embodiment, the lid plate 4a is processed into substantially the same shape as the upper surface 2a of the wiring substrate 2, and in a state in which the shield case 4 is fixed, a side surface 2c of the wiring substrate 2 and the side plate 4b of the shield case 4 are disposed on substantially the same plane.

Each columnar member 5 is formed of, for example, a conductive resin in which metal powder is mixed into an epoxy resin, and the columnar members 5 are disposed one by one at each of the four corner portions of the lid plate 4a, when viewed in a direction perpendicular to the upper surface 2a of the wiring substrate 2, at a position covered with the shield case 4 (refer to FIG. 2). At this time, each columnar member 5 stands on the wiring substrate 2 in a state where a lower end portion of each columnar member 5 is fixed to a mounted grounding electrode (not shown) formed on the upper surface 2a of the wiring substrate 2.

An upper end portion of each columnar member 5 is fixed to the shield case 4 in a state of being in contact with the lid plate 4a. At this time, each columnar member 5 is disposed in a state in which a part of the side surface thereof is in contact with the side plate 4b of the shield case 4. That is, the upper end portion of each columnar member 5 is connected to an end edge portion of the lid plate 4a of the shield case 4 when viewed in a direction perpendicular to the upper surface 2a of the wiring substrate 2. Further, as illustrated in FIG. 1, the upper end portion of each columnar member 5 has a shape that is larger than the cross section of the other portion of the columnar member 5, and functions as a connection portion to the lid plate 4a. With such a configuration, the shield case 4 is fixed to the wiring substrate 2 by using the respective columnar members 5 and is electrically connected to the grounding electrodes of the wiring substrate 2 via the respective columnar members 5.

Note that, a part of the side surface of each columnar member 5 does not have to be in contact with the side plate 4b of the shield case 4.

(Method of Manufacturing High-Frequency Component 1a)

Next, a method of manufacturing the high-frequency component 1a will be described with reference to FIG. 4.

Figure 4A:
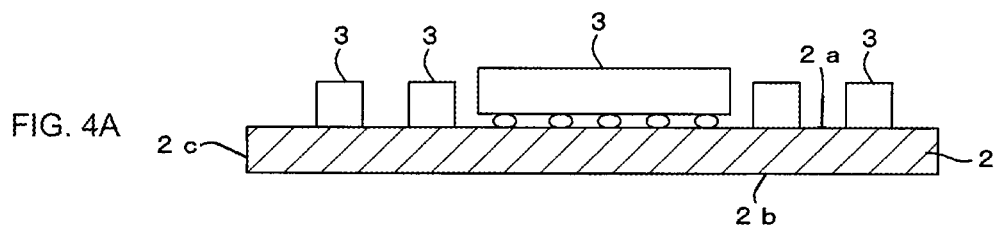
FIGS. 4A, 4B, 4C, 4D and 4E include diagrams illustrating a method of manufacturing the high-frequency component in FIG. 1.

First, as illustrated in FIG. 4A, the wiring substrate 2 having various wiring electrodes and via conductors formed on the main surfaces (upper surface 2a, lower surface 2b) and the inside thereof is prepared, and each component 3 is mounted on the upper surface 2a of the wiring substrate 2 by using known surface mount technology.

Figure 4B:
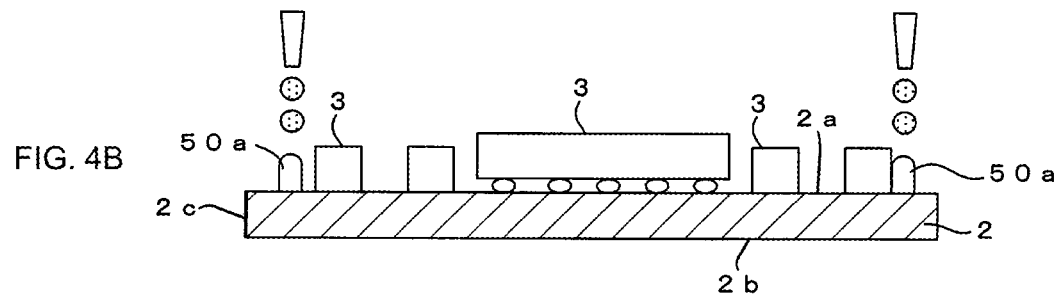

Next, as illustrated in FIG. 4B, a first portion 50a corresponding to a portion excluding the upper end portion of the columnar member 5 is formed on the grounding electrode formed at each of the four corners of the upper surface 2a of the wiring substrate 2. For example, the first portion 50a is formed into a columnar shape by stacking a conductive resin by a dispensing method or the like, and the first portion 50a is cured in a temperature environment having a temperature equal to or higher than a curing temperature of the conductive resin.

Figure 4C:
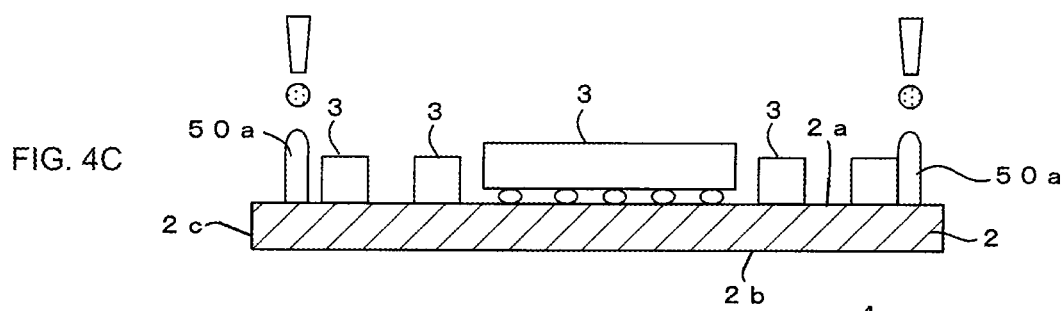

Next, as illustrated in FIG. 4C, the conductive resin is applied to an upper end of the first portion 50a by potting to form a second portion 50b corresponding to the upper end portion of the columnar member 5, and the conductive resin is further stacked thereon. At this time, the conductive resin of the second portion 50b remains in an uncured state. The conductive resin forming the second portion 50b is preferably the same as that of the first portion 50a.

Figure 4D:
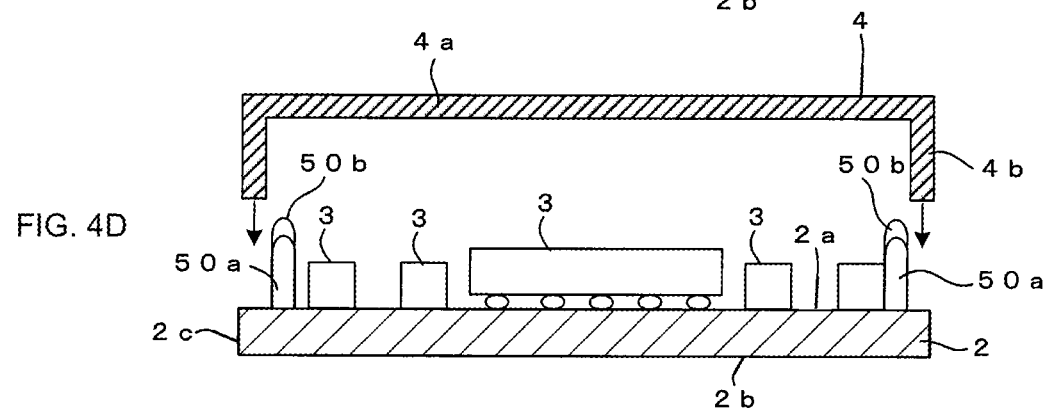

Next, as illustrated in FIG. 4D, the shield case 4 is disposed on the upper surface 2a of the wiring substrate 2 by using the first portion 50a of each columnar member 5 as a guide member. A single metal plate is processed into a shape as illustrated in FIG. 3, and the respective side plates 4b are then bent at approximately 90° to form a box shape of the shield case 4. Note that since the first portion 50a forming each columnar member 5 is disposed at each of the four corners of the wiring substrate 2 in a cured state, the first portion 50a of each columnar member 5 also functions as a positioning pin for the shield case 4. Further, when the shield case 4 is disposed, the second portion 50b of each columnar member 5 is squashed into a shape that is larger than a cross section of the first portion 50a. When the respective columnar members 5 are formed as described above, the shield case 4 and the columnar members 5 can be reliably connected and fixed even if the height of each of the first portions 50a from the wiring substrate 2 is different.

Figure 4E:
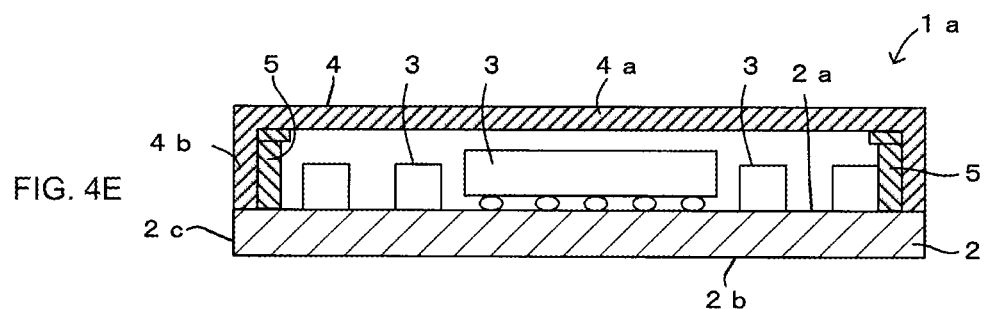

The conductive resin of the second portion 50b is cured in this state, so as to complete the high-frequency component 1a (FIG. 4E). At this time, the second portion 50b serves as an adhesive between the columnar member 5 and the shield case 4 and fixes the shield case 4 to the wiring substrate 2. Further, since each columnar member 5 is connected to the grounding electrode of the wiring substrate 2, the shield characteristics of the shield case 4 can be ensured.

In addition, when the shield case 4 is formed by bending, a gap is formed between the adjacent side plates 4b, but the gap is formed at each of the four corner portions of the lid plate 4a, that is, at the position where each columnar member 5 is disposed. Therefore, each columnar member 5 also functions as a complementary member of the shield case 4 that fills the gap.

Thus, according to the embodiment described above, since the shield case 4 is fixed to the wiring substrate 2 by the columnar members 5 covered with the shield case 4, it is not necessary to provide a space for disposing an adhesive for fixing on the outer side portion of the shield case as compared to the high-frequency component of the related art. Further, since the columnar member 5 connected to both the shield case 4 and the grounding electrode of the wiring substrate 2 is formed of the conductive resin, it is not necessary to provide a concave portion for forming a grounding electrode on the wiring substrate or to provide on the shield case a leg portion to connect to a grounding electrode of the wiring substrate, as in the case of a high-frequency component of the related art. Further, when the respective columnar members 5 are disposed on the upper surface 2a of the wiring substrate 2, since they are made of soft uncured conductive resin, a margin between each columnar member 5 and the component 3 can be reduced. Accordingly, the size of the high-frequency component 1a can be reduced.

In addition, when the shield case 4 is formed by bending using a single metal plate as in the embodiment, the shield case 4 can be formed at a low cost, but there is a problem that gaps are formed between the adjacent side plates 4b, resulting in the deterioration of the shield characteristics. Consequently, a method of forming a shield case by press-molding with a mold to mitigate the formation of such gaps (for example, press drawing) may be used, but there is an adverse effect that the cost of forming the shield case is increased. In this embodiment, since each columnar member 5 is disposed between adjacent side plates 4b, even when there is a gap between adjacent side plates 4b, the columnar members 5 disposed in the gaps can suppress the deterioration of the shield characteristics. Therefore, the shield case 4 may be formed at a low cost while maintaining the shield characteristics.

In addition, in a structure of the related art in which a shield case is provided with a leg portion, it is necessary to ensure a design margin between the component and the shield case for preventing the component from being broken when the shield case is mounted. But, in the present embodiment, each columnar member 5 functions as a positioning pin, and the shield case 4 and the component 3 can be prevented from being brought into contact with each other. Accordingly, since the margin can be reduced, compared with the structure of the related art, it will be easier to make the size of the high-frequency component 1a smaller.

In addition, when solder is used to fix the shield case to the wiring substrate, there is a possibility that the solder melts due to the heat when the high-frequency component is mounted on the motherboard and the shield case falls off. But, in this embodiment, since the shield case 4 is fixed by the columnar members 5 formed of the conductive resin, such falling off can be prevented.

Second Embodiment

A high-frequency component according to a second embodiment of the present disclosure will be described with reference to FIG. 5 to FIG. 7. Note that FIG. 5 is a sectional view of the high-frequency component, FIG. 6 is a plan view of the high-frequency component, and FIG. 7 is a developed view of a shield case.

Figure 5:
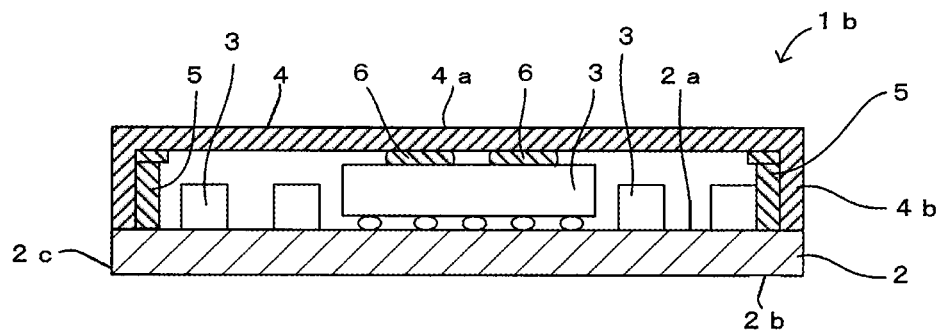
FIG. 5 is a sectional view of a high-frequency component according to a second embodiment of the present disclosure.
Figure 6:
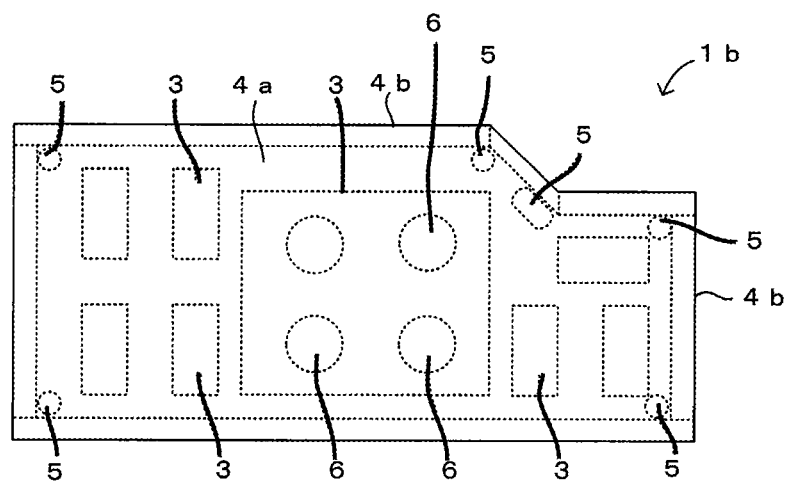
FIG. 6 is a plan view of the high-frequency component in FIG. 5.
Figure 7:
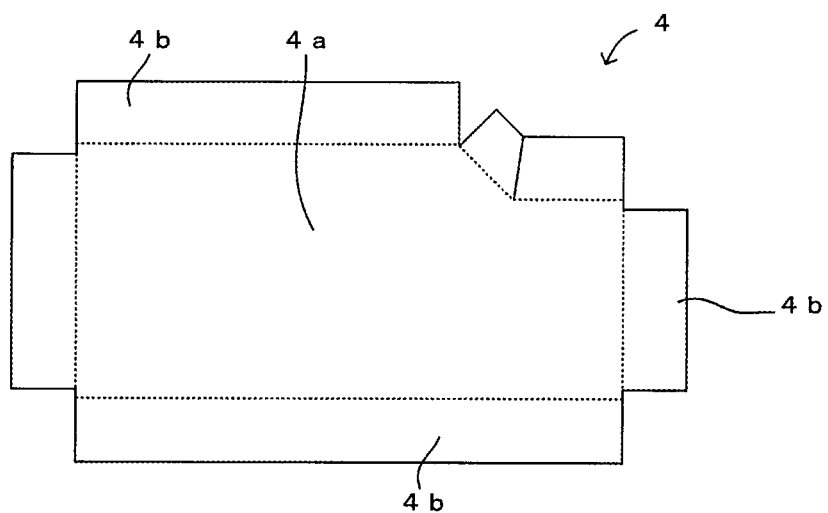
FIG. 7 is a diagram illustrating a shield case in FIG. 5.

A high-frequency component 1b according to this embodiment differs from the high-frequency component 1a according to the first embodiment in that, as illustrated in FIG. 5 and FIG. 6, the shapes of the wiring substrate 2 and the shield case 4 are different from those of the high-frequency component 1a, and a connecting member 6 is provided between a component 3 and the lid plate 4a of the shield case 4. Since other configurations are the same as those of the high-frequency component 1a according to the first embodiment, the description thereof will be omitted by assigning the same reference signs thereto.

In this case, as illustrated in FIG. 6, the main surfaces (the upper surface 2a and the lower surface 2b) of the wiring substrate 2 have a shape in which one of four corners of a rectangular shape is cut out. In accordance with this shape, the lid plate 4a of the shield case 4 is also formed in substantially the same shape as the main surfaces (the upper surface 2a, the lower surface 2b) of the wiring substrate 2. At this time, as illustrated in FIG. 6, when viewed in a direction perpendicular to the upper surface 2a of the wiring substrate 2, each of the upper surface 2a of the wiring substrate 2 and the lid plate 4a has six bent portions formed on a peripheral line thereof. In addition, the grounding electrode (not shown) is provided on the upper surface 2a of the wiring substrate 2 in the vicinity of each of the six bent portions, and the lower end portion of the columnar member 5 is fixed to each of these electrodes, so that each columnar member 5 stands on the upper surface 2a of the wiring substrate 2.

In addition, the shield case 4 is formed by bending a single sheet of metal plate as in the first embodiment. Therefore, as illustrated in FIG. 7, the shield case 4 before the bending is formed in such a shape that the single lid plate 4a and six rectangular side plates 4b are integrally formed on the same plane. The shield case 4 is disposed on the upper surface 2a of the wiring substrate 2 by using the respective columnar members 5 as positioning pins. At this time, each columnar member 5 is disposed at a position of each bent portion of the lid plate 4a of the shield case 4, and the upper end portion of the columnar member 5 is fixed to the lid plate 4a at this position.

Further, on the component 3 disposed in a center of FIG. 6, the connecting member 6 that is disposed between an upper surface of the component 3 and the lid plate 4a of the shield case 4 and connects the component 3 and the lid plate 4a to each other is provided. In this embodiment, the connecting member 6 is formed of the same conductive resin as the one forming the columnar member 5, and the connecting members 6 are disposed at four positions on the upper surface of the component 3.

(Method of Manufacturing High-Frequency Component 1b)

Next, a method of manufacturing the high-frequency component 1b will be described with reference to FIG. 8, focusing on a difference from the first embodiment.

Figure 8A:
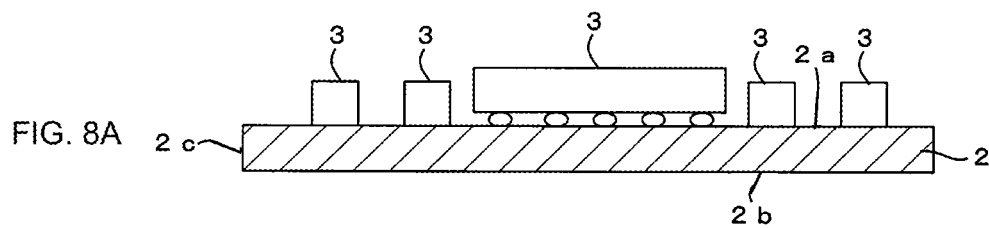
FIGS. 8A, 8B, 8C, 8D and 8E include diagrams illustrating a method of manufacturing the high-frequency component in FIG. 5.
Figure 8B:
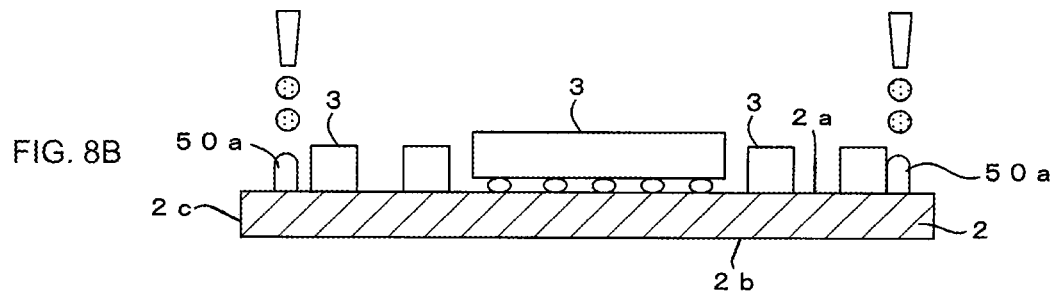

First, as illustrated in FIG. 8A, each component 3 is mounted on the upper surface 2a of the wiring substrate 2 in the same manner as in the first embodiment. Further, as illustrated in FIG. 8B, the first portion 50a of each columnar member 5 is formed in the same manner as in the first embodiment.

Figure 8C:
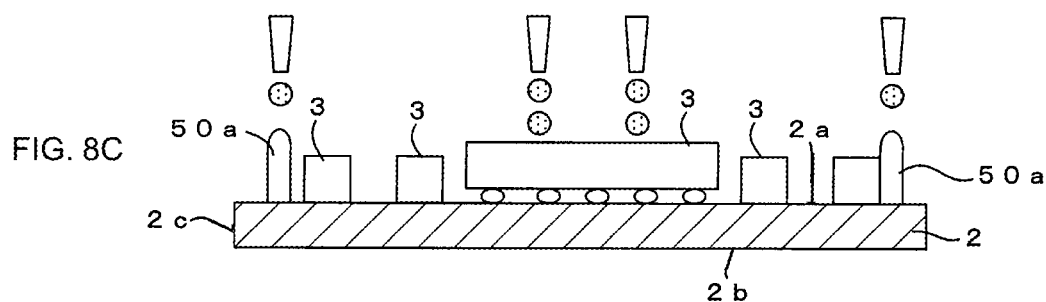

Next, as illustrated in FIG. 8C, in the same manner as in the first embodiment, the conductive resin which forms the second portion 50b is applied by potting to the upper end of the first portion 50a of each columnar member 5, and the conductive resin is further stacked. At this time, the conductive resin which forms the connecting member 6 is also applied to the four positions on the upper surface of the specific component 3 (in this embodiment, the component 3 disposed in the center of FIG. 6) (simultaneous formation of the second portion 50b and the connecting member 6). It is preferable that the second portion 50b and the connecting member 6 be made of the same conductive resin.

Figure 8D:
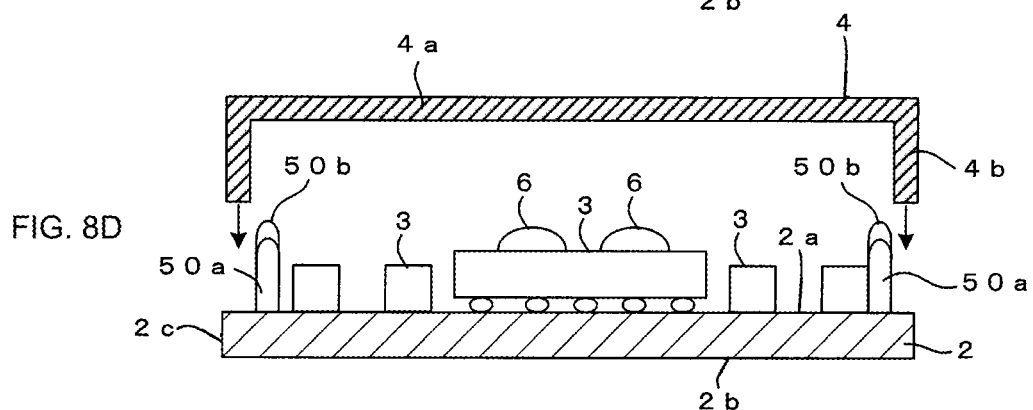

Next, as illustrated in FIG. 8D, before the conductive resin forming the second portion 50b of each columnar member 5 and the conductive resin forming the connecting member 6 are cured, the shield case 4 formed by the bending is disposed on the upper surface 2a of the wiring substrate 2. At this time, the first portion 50a of each columnar member 5 is used as a guide member. Note that since the first portion 50a forming each columnar member 5 is disposed at each of the four corners of the wiring substrate 2 in a cured state, the first portion 50a of each columnar member 5 also functions as a positioning pin for the shield case 4. Further, when the shield case 4 is disposed, the second portion 50b of each columnar member 5 is squashed into a shape that is larger than a cross section of the first portion 50a. Also, the connecting member 6 is squashed in the same manner as the second portion 50b of each columnar member 5.

Figure 8E:
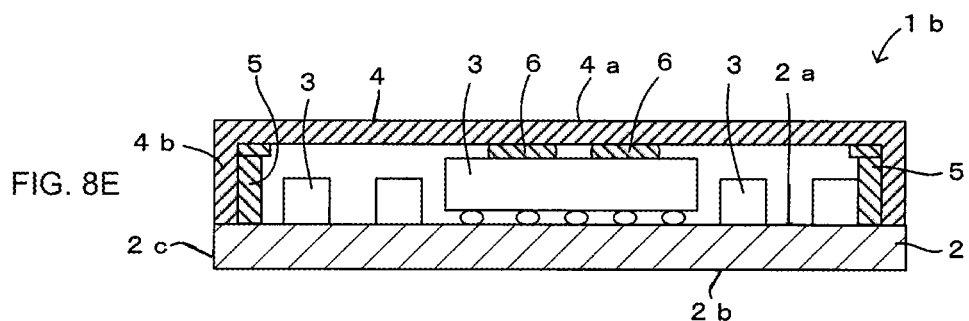
Figure 9:
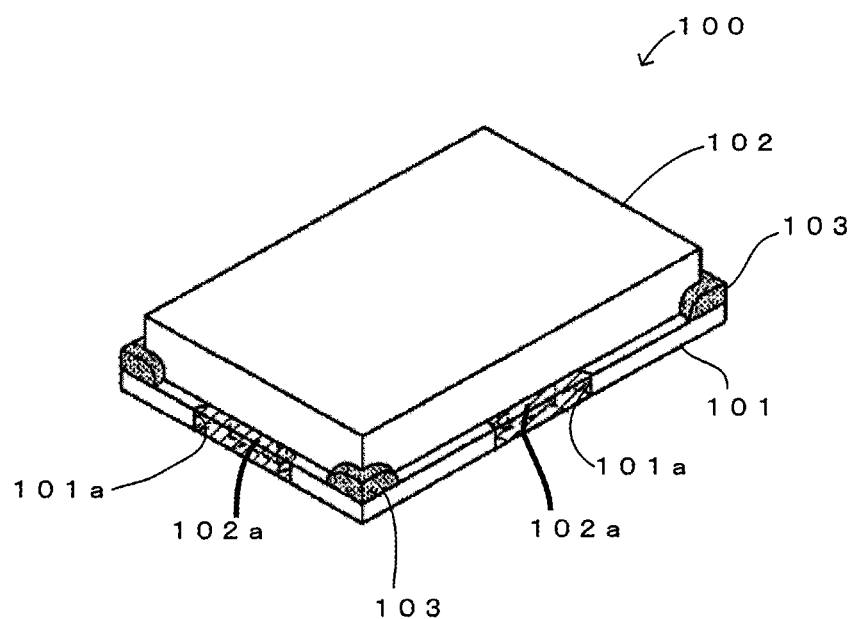
FIG. 9 is a perspective view of a high-frequency component of the related art.

In this state, the conductive resin of the second portion 50b and the connecting member 6 is cured, so as to complete the high-frequency component 1b (FIG. 8E). At this time, the second portion 50b serves as an adhesive between the columnar member 5 and the shield case 4 and fixes the shield case 4 to the wiring substrate 2. Also, since the connecting member 6 connects the component mounted on the wiring substrate 2 and the shield case 4, the connecting member 6 also contributes to the fixing of the shield case 4 to the wiring substrate 2. Further, since each columnar member 5 is connected to the grounding electrode of the wiring substrate 2, the shield characteristics of the shield case 4 can be ensured.

Therefore, according to this embodiment, effects similar to those of the first embodiment can be obtained. Further, as in the present embodiment, when the lid plate 4a of the shield case 4 has an asymmetrical shape (see FIG. 6) different from a rectangular shape, if leg portions for fixing are provided in the shield case as in the structure of the related art, it is difficult to balance the stress acting on the leg portions in fixing the shield case, and there is a possibility that the shield case is deformed. In this way, when there is a possibility that the shield case may be deformed at the time of the fixing, it is necessary to design the shield case in consideration of the deformation amount in order to prevent the shield case from being in contact with a component to be shielded, for example, and thus the shield case may become large. However, in this embodiment, since the shield case 4 can be fixed to the wiring substrate 2 without providing the leg portions, even when the lid plate 4a of the shield case 4 has a shape different from a rectangular shape, the shield case 4 can be prevented from being deformed at the time of the fixing. Therefore, a margin in consideration of the deformation in fixing the shield case 4 can be reduced, and even when the upper surface 2a of the wiring substrate 2 and the lid plate 4a of the shield case 4 are not rectangular, the size of the shield case 4 can be easily reduced.

Further, since the columnar member 5 and the connecting member 6 are formed of the same conductive resin, when the conductive resin of both the members 5 and 6 is cured, the stress acting on a fixing portion between the columnar member 5 and the shield case 4 or the wiring substrate 2 and the stress on the component 3 on which the connecting member 6 is disposed are not easily applied, so that the reliability of the high-frequency component 1b can be improved.

Further, since the connecting member 6 is formed of the conductive resin, the heat dissipation characteristics of the component 3 on which the connecting member 6 is disposed can be improved. Further, since the connecting member 6 is disposed between the lid plate 4a of the shield case 4 and the upper surface of the component 3, even when external stress acts on the lid plate 4a toward the component 3 side, the shield case 4 is not deformed easily and the component 3 can be prevented from being broken due to the external stress. Further, since the deformation of the shield case 4 due to the external stress is reduced, a distance between the upper surface of the component 3 and the lid plate 4a of the shield case 4 can be reduced in design, so that the height of the high-frequency component 1b can be reduced.

It should be noted that the present disclosure is not limited to the above-described embodiments, and various modifications can be made without departing from the spirit and scope of the present disclosure. For example, the configurations of the above-described embodiments may be combined.

Further, in each of the above-described embodiments, the case is described in which each columnar member 5 is disposed at each bent portion of the wiring substrate 2 and the lid plate 4a when viewed in a direction perpendicular to the upper surface 2a of the wiring substrate 2, but it may be disposed at a different position as long as the position is on the upper surface 2a of the wiring substrate 2 or at the end edge portion of the lid plate 4a. In addition, the number of the columnar members 5 disposed may be changed as appropriate, such that the columnar members 5 are disposed not only at the bent portions of the wiring substrate 2 and the lid plate 4a but also at other positions.

Further, the present disclosure can be applied to various high-frequency components provided with a shield case.

1a, 1b HIGH-FREQUENCY COMPONENT
2 WIRING SUBSTRATE
3 COMPONENT
4 SHIELD CASE
4a LID PLATE
4b SIDE PLATE
5 COLUMNAR MEMBER
6 CONNECTING MEMBER

The invention claimed is:

1. A high-frequency component, comprising:
a wiring substrate;
a component mounted on a main surface of the wiring substrate;
a columnar member including a conductive resin and standing on the main surface of the wiring substrate in a state where one end of the columnar member is fixed to the main surface of the wiring substrate; and
a shield case covering the component and the columnar member, wherein
the shield case has a lid plate and a side plate, wherein the lid plate is disposed so as to face to the main surface of the wiring substrate, and the side plate extends from an edge of the lid plate toward the main surface of the wiring substrate,
another end of the columnar member is fixed to an end edge portion of the lid plate when viewed in a direction perpendicular to the main surface of the wiring substrate, and
the other end of the columnar member has a shape that is larger than a cross section of other portions of the columnar member.

2. The high-frequency component according to claim 1, wherein
the lid plate has a bent portion on a peripheral line of the lid plate when viewed in a direction perpendicular to the main surface of the wiring substrate, and
the other end of the columnar member is fixed to a predetermined region including the bent portion of the end edge portion of the lid plate.

3. The high-frequency component according to claim 1, further comprising:
a connecting member disposed between the component and the lid plate to connect the component and the lid plate to each other, wherein
the connecting member includes a resin of the same type as the conductive resin included in the columnar member.

4. The high-frequency component according to claim 2, further comprising:
a connecting member disposed between the component and the lid plate to connect the component and the lid plate to each other, wherein
the connecting member includes a resin of the same type as the conductive resin included in the columnar member.

5. The high-frequency component according to claim 1, wherein the main surface of the wiring substrate and the lid plate of the shield case each has a rectangular shape.

6. The high-frequency component according to claim 1, wherein the main surface of the wiring substrate and the lid plate of the shield case each has a shape in which a portion of one of four corners of a rectangular shape is cut out.

* * * * *